United States Patent [19]

Sundstrom

[11] Patent Number: 5,602,494
[45] Date of Patent: Feb. 11, 1997

[54] BI-DIRECTIONAL PROGRAMMABLE I/O CELL

[75] Inventor: Lance L. Sundstrom, Pinellas Park, Fla.

[73] Assignee: Honeywell Inc., Minneapolis, Minn.

[21] Appl. No.: 401,604

[22] Filed: Mar. 9, 1995

[51] Int. Cl.$^6$ .............................................. H03K 19/0175
[52] U.S. Cl. ................... 326/39; 326/30; 326/86
[58] Field of Search .......................... 326/30, 33, 38–39, 326/41, 86

[56]  References Cited

U.S. PATENT DOCUMENTS

| 4,758,746 | 7/1988 | Birkner et al. | 326/39 |
| 5,134,311 | 7/1992 | Biber et al. | 326/30 X |
| 5,162,672 | 11/1992 | McMahan et al. | 326/30 X |
| 5,172,014 | 12/1992 | El Ayat et al. | 326/41 |
| 5,394,034 | 2/1995 | Becker et al. | 326/39 |
| 5,448,182 | 9/1995 | Countryman et al. | 326/30 |

*Primary Examiner*—David R. Hudspeth

[57] ABSTRACT

A bi-directional programmable I/O cell is disclosed. The bi-directional programmable I/O cell has variable electrical characteristics which are selected via control inputs. The variable electrical characteristics can include a data transmission mode, an input bias impedance value and an input bias direction mode. The input bias direction mode has an independent submode and a dependent submode. The dependent submode can operate in a ring latch mode or an active termination mode. The independent submode is further comprised of a static submode and a dynamic submode. The static submode is further comprised of a pull-up mode and a pull-down mode. The bias impedance value is can be selected from a plurality of impedances. The bi-directional programmable I/O cell has a continuous or pulsed output in the data transmission mode.

22 Claims, 4 Drawing Sheets

BI-DIRECTIONAL PROGRAMMABLE I/O CELL

BACKGROUND OF THE INVENTION

1. Field of the Invention

The present invention relates generally to the transmission, biasing and termination of digital data. More particularly, the present invention presents an I/O cell with programmable active input bias.

2. Description of the Related Art

Today, most electronic systems and many electronic devices (e.g. multichip modules or MCMs) contain several integrated circuits or ICs. Most IC die are comprised of core electronics at its center and input/output electronics, or an I/O ring at its periphery. The core electronics usually perform the primary function of the IC while the I/O ring provides a buffered external interface.

The I/O ring is typically comprised of several (sometimes hundreds) of I/O cells, one for each external signal of the IC. The I/O ring may contain several I/O cell types (e.g. input cells, output cells, tristate output cells and bi-directional cells), one for each external signal type. The transistors of the I/O ring are much larger than those of the core electronics. The core electronics drive devices are contained entirely within the IC die, while the I/O cells typically drive the an external media or devices external to the IC die. Depending on the particular application, the external media is typically referred to as an interconnect, a net, a backplane, a bus, or a bi-directional data line.

I/O cells of different ICs can have different electronic operating characteristics. When two or more I/O cells of different ICs are connected together through a media, the connecting net often requires some form of biasing (pull-up or pull-down) and/or termination to ensure the error-free operation of all the connected I/O cells.

For example, some nets connect a TTL output cell to a CMOS input cell. Such a net requires a pull-up resistor to ensure that the TTL logic high output voltage exceeds the logic high switching threshold voltage of the CMOS input.

Similarly, biasing is typically required in a net connecting two or more tristate output or bi-directional cells. Such a net may require a pull-up or a pull-down resistor to ensure that the net voltage is at a valid logic level when none of the connected I/O cells are driving.

Biasing is also required in nets having physically long trace lengths, such as I/O cells connected across a backplane. When twice the propagation delay of the connecting trace exceeds the edge rates (output rise and fall times) of the connected I/O cells, that trace must be treated like a transmission line. Transmission line effects, such as ringing, overshoots and undershoots, result from I/O driver loading by the characteristic impedance, identified as $Z_O$, of the connecting trace and signal reflections off impedance discontinuities along the length and especially at the ends of the trace. Such effects can cause data signals to inadvertently cross logic thresholds, which is detrimental or even fatal to device operation.

To minimize these effects, terminations are required at one or both ends of the trace. Terminations have been designed to provide an impedance that closely matches the characteristic impedance of the trace, thus reducing the effective impedance discontinuities and thereby reducing reflections.

As circuit complexity, clock frequencies and edge rates have increased, the number of interconnects requiring biasing and/or termination has increased. Unfortunately, implementing bias and termination requirements with discrete components at the MCM or printed wiring assembly (PWA) level can consume a considerable amount of valuable multichip package (MCP) and/or primed wiring board (PWB) area resulting in increased system size, weight, power requirements and cost.

Currently, some ICs utilize fixed I/O cell biasing at the wafer-level. This biasing usually consists of a single bias resistor with one end tied to the external port of the I/O pad to be biased and the other end tied to a fixed DC level, either power or ground. Unfortunately, The use of fixed wafer-level biasing has been limited because of the varying and often conflicting application dependent bias requirements at the MCM, PWA and/or system levels.

SUMMARY OF THE INVENTION

A bi-directional programmable I/O cell is disclosed. The bi-directional programmable I/O cell has variable electrical characteristics which are selected via control inputs. The variable electrical characteristics can include a data transmission mode, an input bias impedance value and an input bias direction mode. The input bias direction mode has an independent submode and a dependent submode. The dependent submode can operate in a ring latch mode or an active termination mode. The independent submode is further comprised of a static submode and a dynamic submode. The static submode is further comprised of a pull-up mode and a pull-down mode. The bias impedance value is can be selected from a plurality of impedances. The bi-directional programmable I/O cell has a continuous or pulsed output in the data transmission mode.

DESCRIPTION OF THE PREFERRED EMBODIMENTS

Figure 1:
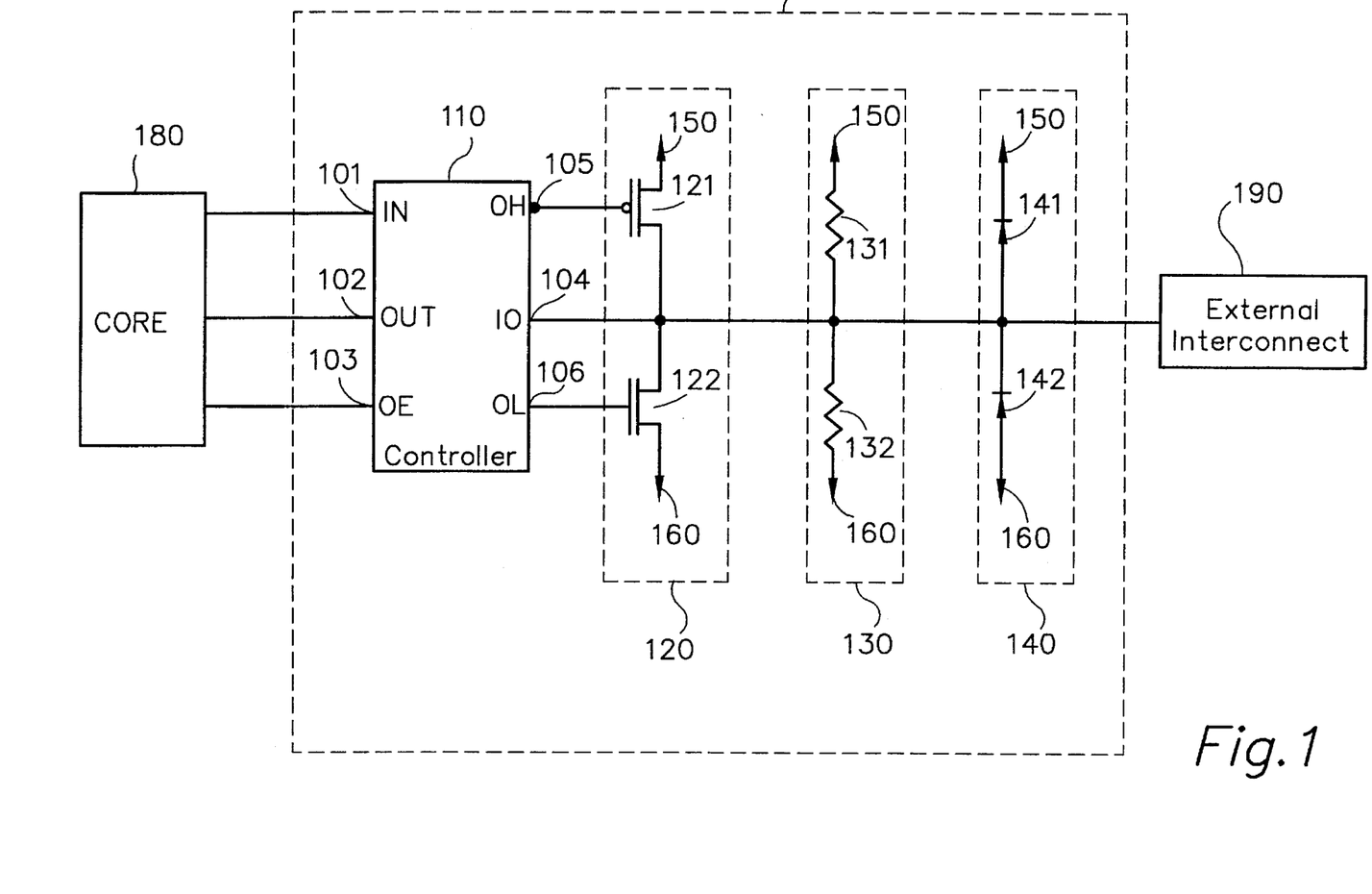
FIG. 1 is a schematic diagram of a CMOS bi-directional I/O cell.

FIG. 1 schematically depicts a CMOS bi-directional I/O cell 100 connected between a core 180 and an external interconnect 190. I/O cell 100 is comprised of a controller 110, an output drive block 120, a bias block 130 and an input protection block 140. Controller 110 has an IN port 101, an OUT port 102, an OE port 103, an IO port 104, an OH port 105 and an OL port 106. Table 1 provides a description of the aforementioned ports and describes whether controller 110 receives an input signal from the port (input) or transmits an output signal from the port (output).

TABLE 1

| Controller 110 Ports | | |
|---|---|---|
| Port | Description | Type |
| IN port 101 | Data input from core | Input |
| OUT port 102 | Data output to core | Output |
| OE port 103 | External output enable | Input |
| IO port 104 | External data input | Input |

TABLE 1-continued

Controller 110 Ports

| Port | Description | Type |
|---|---|---|
| OH port 105 | Pull-up transistor control | Output |
| OL port 106 | Pull-down transistor control | Output |

In the preferred embodiment, output drive block 120 is comprised of a p-channel pull-up transistor 121 and an n-channel pull-down transistor 122 arranged in a totem-pole configuration. The source of pull-up transistor 121 is connected to a positive supply 150 and the drain is connected to external interconnect 190. The drain of pull-down transistor 122 is connected to external interconnect 190 while the source is connected to negative supply 160. The gate of pull-up transistor 121 is connected to OH port 105, while the gate of pull-down transistor 122 is connected to OL port 106. The digital signals on OH port 105 and OL port 106 can be referred to as drive block control signals. Table 2 is a truth table describing the output state of drive block 120, based on the logic levels of the signals at OH port 105 and OL port 106 and the corresponding operation of transistors 121 and 122.

TABLE 2

Truth Table for Drive Block 120

| Inputs (Drive Block Control Signals) | | Pull-up | Pull-down | |
|---|---|---|---|---|
| OH port 105 | OL port 106 | Transistor 121 | Transistor 122 | Output State |
| 0 | 0 | On | Off | High drive |
| 0 | 1 | Not allowed | | Not allowed |
| 1 | 0 | Off | Off | No drive |
| 1 | 1 | Off | On | Low drive |

0 = logic low, 1 = logic high

In the preferred embodiment, bias block 130 is comprised of a pull-up resistor 131 and a pull-down resistor 132. Pull-up resistor 131 is connected between the positive supply 150 and external interconnect 190, while pull-down resistor 132 is connected between external interconnect 190 and the negative supply 160. One skilled in the art will recognize that a weak transistor can be substituted for resistors 131 and 132. Bias block 130 ensures that the voltage on external interconnect 190 is pulled to a valid logic level when transistors 121 and 122 are off.

In the preferred embodiment, input protection block 140 is comprised of a positive clamp diode 141 and a negative clamp diode 142. The anode of the positive clamp diode 141 and the cathode of the negative clamp diode 142 are connected to external interconnect 190. The cathode of the positive clamp diode 141 is connected to the positive supply 150, while the anode of the negative clamp diode 142 is connected to the negative supply 160. Diodes 141 and 142 clamp the voltage on external interconnect 190 to one diode drop above and below the positive and negative supplies, respectively.

I/O cell 100 exchanges data between core 180 and external interconnect 190. Thus, I/O cell 100 has an output data path from core 180 to IN port 101 to OH port 105 and OL port 106, which correspondingly controls transistors 121 and 122 which, in turn, drive external interconnect 190 to a voltage. Similarly, I/O cell 100 has an input data path from external interconnect 190 to IO port 104 to OUT port 103 to core 180.

Controller 110 performs the logic function described by the truth table depicted in Table 3. One skilled in the art will recognize how to construct the circuitry needed to perform the described function. It should be noted that OH port 105 and OL port 106 drive the gates of p-channel transistor 121 and n-channel transistor 122, respectively, and are a function of the logical signals on IN port 101 and OE port 103. The logical signal on OUT port 102 is a buffered version of the logical signal on IO port 104.

TABLE 3

Truth Table for Controller 110

| Inputs | | | Outputs | | |
|---|---|---|---|---|---|
| IN | OE | IO | OH | OL | OUT |
| 0 | 0 | 0 | 1 | 0 | 0 |
| 0 | 0 | 1 | 1 | 0 | 1 |
| 0 | 1 | 0 | 1 | 1 | 0 |
| 1 | 0 | 0 | 1 | 0 | 0 |
| 1 | 0 | 1 | 1 | 0 | 1 |
| 1 | 1 | 1 | 0 | 0 | 1 |

0 = logic low, 1 = logic high

Figure 2:
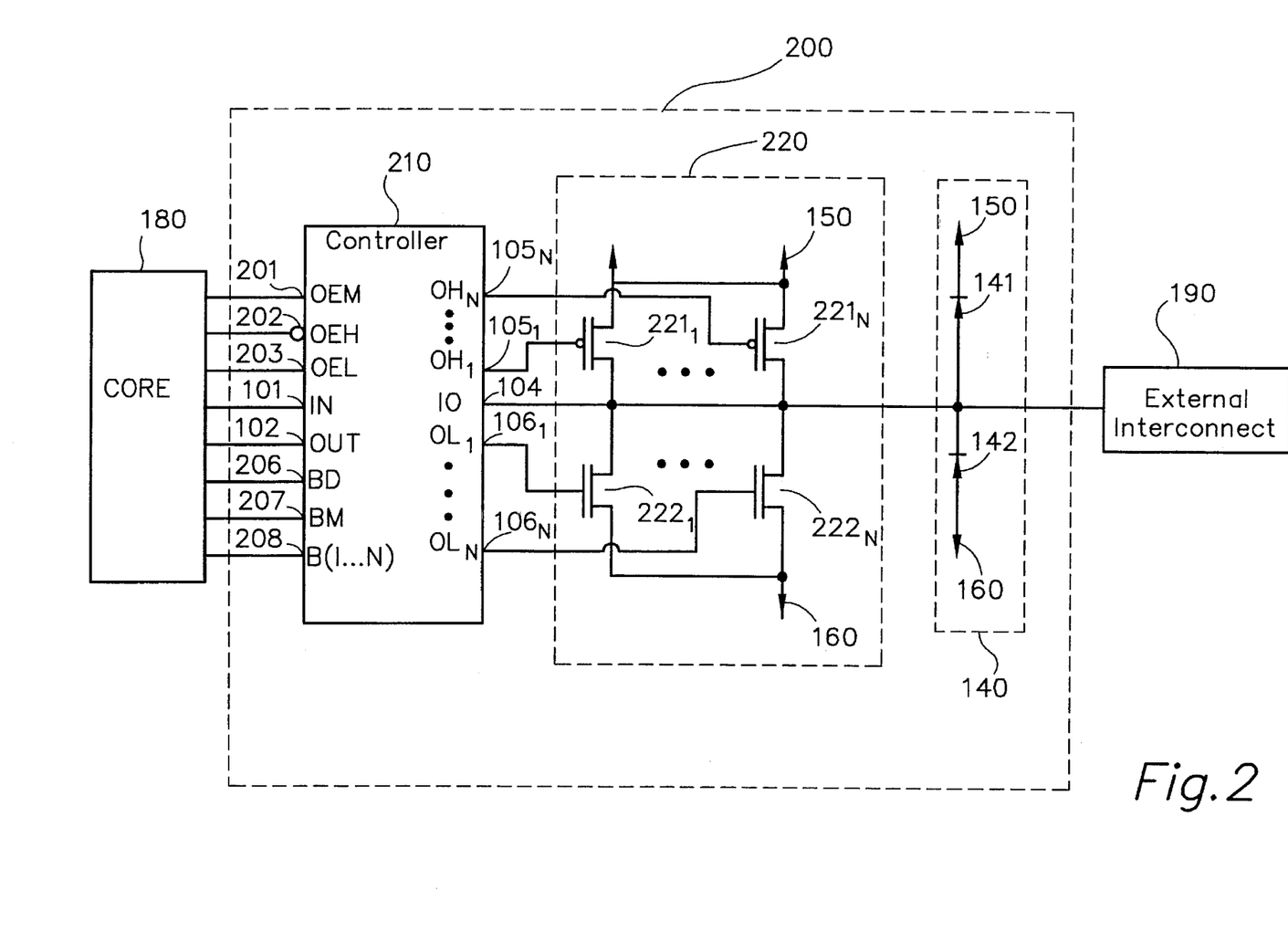
FIG. 2 is a schematic diagram of a bi-directional I/O cell having multiple programmable active input biases.

FIG. 2 schematically depicts a bi-directional programmable I/O cell 200. It should be noted that components having the same function as described in FIG. 1 have retained the same numerical identification. Bi-directional programmable I/O cell 200 is comprised of a controller 210, a drive block 220 and an input protection block 140.

Controller 210 has an OEM port 201, an OEH port 202, an OEL port 203, an IN port 101, an OUT port 102, a BD port 206, a BM port 207, at least two B ports $208_1$ and $208_N$, at least two OH ports $105_1$ and $105_N$ an I/O port 104 and at least two OL ports $106_1$ and $106_N$. Table 4 provides a description of the aforementioned ports and describes whether controller 210 receives an input signal from the port (input) or transmits an output signal from the port (output). In the preferred embodiment, all of the input signals, except for the signal on IO port 104, are generated by core 180.

TABLE 4

Controller 210 Ports

| Name | Description | Type |
|---|---|---|
| OEM 201 | External data output enable mode select | Input |
| OEH 202 | External data output enable — active high | Input |
| OEL 203 | External data output enable — active low | Input |
| IN 101 | Data input from core | Input |
| OUT 102 | Data output to core | Output |
| BD 206 | Input bias default select | Input |
| BM 207 | Input bias mode select | Input |
| B(N:1) 208 | Multiple input bias impedance select | Input |
| $OH_N$ $105_N$ | Control for pull-up transistor $221_N$ | Output |
| IO 104 | External data input | Input |
| $OL_N$ $106_N$ | Control for pull-down transistor $222_N$ | Output |

In this particular embodiment, drive block 220 is comprised of one or more p-channel pull-up transistors $221_N$ and n-channel pull-down transistor $222_N$, arranged in totem pole pairs. The gate of pull-up transistor $221_1$ is connected to the $OH_1$ port $105_1$ of controller 210, while the gate of pull-down transistor $222_1$ is connected to the $OL_1$ port $106_1$ of controller 210. Likewise, the gate of pull-up transistor $221_N$ is connected to the $OH_N$ port $105_N$ of controller 210, while the gate of pull-down transistor $222_N$ is connected to the $OL_N$ port $106_N$ of controller 210. The drains of all transistors 221 and 222 are connected to external interconnect 190. The sources of pull-up transistors 221 are connected to the positive supply 150, while the sources of all pull-down transistors 222 are connected to the negative supply 160.

As will be described, bi-directional programmable I/O cell 200 provides several alterable electrical characteristics, including a data transmission mode, either pulsed or continuous, a bias impedance value or magnitude and a bias direction, either independent or dependent. The input bias direction mode has an independent submode and a dependent submode. The dependent submode can operate in a ring latch mode or an active termination mode. The independent submode is further comprised of a static submode and a dynamic submode. The static submode is further comprised of a pull-up mode and a pull-down mode. The bias impedance value is can be selected from a plurality of impedances. The bi-directional programmable I/O cell has a continuous or pulsed output in the data transmission mode.

Input bias impedance and bias direction on external interconnect 190 are independently controlled. The input bias impedance is controlled by the bias select inputs, B(N:1) port $208_{N:1}$. If N=2, as many as four ($2^N$) different bias impedances can be selected. In the preferred embodiment, four different impedances can be selected: 30 ohms, 50 ohms, 75 ohms and a high impedance. Transistors 221 and 222 are sized for an on-impedance of 50 ohms and transistors $221_2$ and $222_2$ are sized an on-impedance of 75 ohms. In the preferred embodiment, data transmission (output) mode impedance is 30 ohms.

The bias direction is controlled via BM port 207 and BD port 206 and OUT port 102. In the independent bias mode (i.e. BM=0), the bias direction tracks the independent logic level on BD port 206. Thus, if the BD port 206 is at a logic 0, external interconnect 190 is pulled low (i.e. to the negative supply) with the selected bias impedance. Likewise, if the BD port 206 is at a logic 1, external interconnect 190 is pulled high (i.e. to the positive supply) with the selected bias impedance. It should be noted that the logic level at BD port 206 can be either static or dynamic. Thus, if the logic level is dynamic, external interconnect 190 will track the logic level at BD port 206.

In the dependent input bias mode (i.e. BM=1), the bias direction tracks the logic level at OUT port 102, which is dependent on the logic level of I/O port 104, which is being biased. Thus, in dependent mode, the active bias behaves like a ring latch if the impedance of the selected bias impedance is high. A ring latch is useful on bussed nets that connect the outputs of multiple tristate drivers. A ring latch biases a net to its last driven logic state to ensure a valid logic level on the net even when all connected drivers are off (in a high impedance state). It should be noted that typically, an impedance between 1 k-ohms and 10 k-ohms is needed to operate in the ring latch mode.

If the magnitude of the selected bias impedance is close to the characteristic impedance of the connected trace, while bi-directional programmable I/O cell 200 is in the dependent input bias mode, the bias will be in active mode. An active bias behaves like an active transmission line termination. Such a termination has several advantages, including reduced energy consumption, faster logic transitions and reduced tinging effects. One such active termination is described in a co-pending application entitled "Termination Circuit for High Speed Applications", by Lance Sundstrom, Ser. No. 08/269,867, filed Jun. 30, 1994, and herein incorporated by reference.

OEM port 201 determines whether the data transmitted by programmable I/O cell 200 at external interconnect 190 is continuous (OEM=0) or pulsed (OEM=1). In a continuous data output mode, controller 210 activates all pull-up transistors $221_N$ or all pull-down transistors $222_N$ such that the logic level at external interconnect 190 is driven to the logic level at IN port 101 for as long as OEM port 201=0 and OEH port 202=1 and OEL port 203=0. In a pulsed data output mode, controller 210 turns on all pull-up transistors $221_N$ or all pull-down transistors $222_N$ such that the logic level at external interconnect 190 is driven to the logic level at IN port 101 if and for so long as OEM port 201=1 and OEH port 202=1 and OEL port 203=0 and IN port 101≠OUT port 102.

As described, B port 208 provides N different programmable active input biases. In the interest of clarity, FIG. 2 shows only the first (N=1) and the last (N=N) portions of the bias circuitry. Furthermore, all of the truth tables will be defined for a system where N=2. From the description supplied herein, one skilled in the art will recognize how to construct a controller 210 and drive block 220 where N is greater than two.

The signal at OUT port 102 is a buffered version of the signal at the IO port 104. As described in Table 5, the remaining ports on controller 210 are functionally grouped into two sets of input ports, one set for input bias control and the other set for data output control, and a common set of output ports, for drive block control. Hereinafter, functional grouping of ports will be referred to as a control bus.

TABLE 5

Input and Output Control Busses

| Functional Inputs | | |
|---|---|---|
| Input Bias Control | Data Output Control | Outputs Drive Block Control |
| BM 207 | OEM 201 | $OH_N$ $105_N$ |
| BD 206 | OEH 202 | $OL_N$ $106_N$ |
| B(N:1) 208 | OEL 203 | |
| OUT 102 | IN 101 | |
| | OUT 102 | |

The logical value at the ports will determine which of the two input control busses (input bias control or data output control) has active control of the output control bus (drive block control). The active control bus is selected based on the truth table defined in Table 6. At any given time, only one of the two input control busses will be in control.

TABLE 6

Active Input Control Bus Select Truth Table

| OE | OEH | OEL | IN | OUT | Controlling Bus |
|---|---|---|---|---|---|
| X | X | 1 | X | X | Input Bias |
| X | 0 | X | X | X | Input Bias |
| 0 | 1 | 0 | X | X | Data Output |
| 1 | 1 | 0 | 0 | 0 | Input Bias |
| 1 | 1 | 0 | 0 | 1 | Data Output |
| 1 | 1 | 0 | 1 | 0 | Data Output |
| 1 | 1 | 0 | 1 | 1 | Input Bias |

0 = logic low, 1 = logic high, X = don't care

The drive block control outputs as a function of input bias control inputs and the resulting drive block 220 transistor states are defined by the truth table of Table 7.

TABLE 7

Input Bias Mode Truth Table

| Control Inputs | | | | | Control Outputs | | | | Drive Transistors | | | |
|---|---|---|---|---|---|---|---|---|---|---|---|---|
| BM | BD | $B_2$ | $B_1$ | OUT | $OH_1$ | $OL_1$ | $OH_2$ | $OL_2$ | $221_1$ | $222_1$ | $221_2$ | $222_2$ |
| X | X | 0 | 0 | X | 1 | 0 | 1 | 0 | Off | Off | Off | Off |
| 0 | 0 | 0 | 1 | X | 1 | 1 | 1 | 0 | Off | On | Off | Off |
| 0 | 0 | 1 | 0 | X | 1 | 0 | 1 | 1 | Off | Off | Off | On |
| 0 | 0 | 1 | 1 | X | 1 | 1 | 1 | 1 | Off | On | Off | On |
| 0 | 1 | 0 | 1 | X | 0 | 0 | 1 | 0 | On | Off | Off | Off |
| 0 | 1 | 1 | 0 | X | 1 | 0 | 0 | 0 | Off | Off | On | Off |
| 0 | 1 | 1 | 1 | X | 0 | 0 | 0 | 0 | On | Off | On | Off |
| 1 | X | 0 | 1 | 0 | 1 | 1 | 1 | 0 | Off | On | Off | Off |
| 1 | X | 0 | 1 | 1 | 0 | 0 | 1 | 0 | On | Off | Off | Off |
| 1 | X | 1 | 0 | 0 | 1 | 0 | 1 | 1 | Off | Off | Off | On |
| 1 | X | 1 | 0 | 1 | 1 | 0 | 0 | 0 | Off | Off | On | Off |
| 1 | X | 1 | 1 | 0 | 1 | 1 | 1 | 1 | Off | On | Off | On |
| 1 | X | 1 | 1 | 1 | 0 | 0 | 0 | 0 | On | Off | On | Off |

0 = logic low, 1 = logic high, X = don't care

The drive block control outputs are a function of the data output control inputs and the resulting drive block 220 transistor states are defined by the truth table of Table 8. The control block 210 contains the necessary digital logic gates to perform the functions of truth tables Table 6, Table 7 and Table 8.

TABLE 8

Output Drive Mode Truth Table

| Control Inputs | | | Drive Control Outputs | | | | Drive Transistors | | | |
|---|---|---|---|---|---|---|---|---|---|---|
| OE | IN | OUT | $OH_1$ | $OL_1$ | $OH_2$ | $OL_2$ | $221_1$ | $222_1$ | $221_2$ | $222_2$ |
| 0 | 0 | X | 1 | 1 | 1 | 1 | Off | On | Off | On |
| 0 | 1 | X | 0 | 0 | 0 | 0 | On | Off | On | Off |
| 1 | 0 | 1 | 1 | 1 | 1 | 1 | Off | On | Off | On |
| 1 | 1 | 0 | 1 | 0 | 0 | 0 | On | Off | On | Off |

0 = logic low, 1 = logic high, X = don't care

Bi-directional programmable I/O cell 200 implements all input bias functions with transistors 221 and 222 and integrates both the input bias functions and the data output drive functions into drive block 220. Transistors 221 and 222 of the same totem pole transistor pair are sized for the same on-impedance for balance high and low on-impedances. Transistors 221 and 222 of different totem pole transistor pairs are sized for different on-impedances to allow for variable input bias impedance selection. It should be noted that bi-directional programmable I/O cell 200 can be implemented with any complimentary transistor technology, including GaAs, CMOS and bi-polar technologies.

Figure 3:
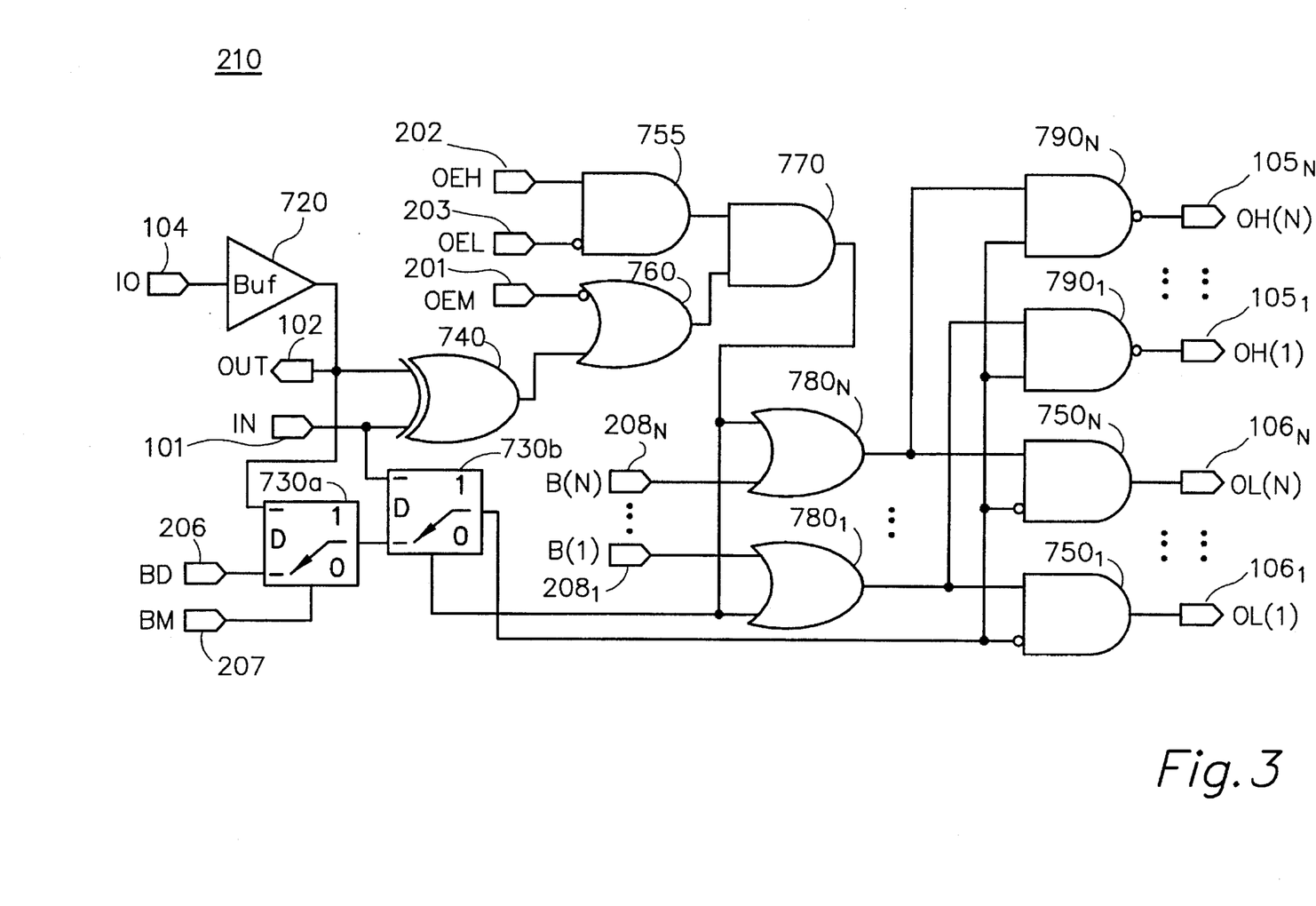
FIG. 3 is a schematic diagram depicting a gate-level implementation of a controller used in a bi-directional I/O cell having multiple programmable active input biases.

FIG. 3 schematically illustrates the preferred gate-level implementation of controller 210. As before, components having the same function as described in the previous figures have retained the same numerical identification. Controller 210 is comprised of a buffer 720, two 2:1 (two-to-one) digital multiplexers 730a and 730b, a 2-input XOR gate 740, at least three 2-input AND gates $750_1$, $750_N$, and 755 having one inverting input, a 2-input OR gate 760 having one inverting input, a 2-input AND gate 770, at least two 2-input OR gates $780_1$ and $780_N$, and at least two 2-input NAND gates $790_1$ and $790_N$. As depicted, IO port 104 is connected to the input of buffer 720. OUT Port 102 is connected to the output of buffer 720, the first input of XOR gate 740 and to the 1-select data input of multiplexer 730a. IN port 101 is connected to the second input of XOR gate 740 and to the 1-select data input of multiplexer 730b. The output of XOR gate 740 is connected to the non-inverting input of OR gate 760. OEM port 201 is connected to the inverting input of OR gate 760. The output of OR gate 760 is connected to the first input of AND gate 770. OEH port 202 is connected to the non-inverting input of AND gate 755. OEL port 203 is connected to the inverting input of AND gate 755. The output of AND gate 755 is connected to the second input of AND gate 770. The output of AND gate 770 is connected to the first inputs of OR gates $780_1$ and $780_N$ and to the select input of multiplexer 730b. BD port 206 is connected to the 0-select data input of multiplexer 730a. BM port 207 is connected to select input of multiplexer 730a. The data output of multiplexer 730a is connected to the 0-select data input of multiplexer 730b. The data output of multiplexer 730b is connected to the inverting inputs of AND gates $750_1$ and $750_N$ and to the first inputs of NAND gates $790_1$ and $790_N$. B(N) port $208_N$ is connected to the second input of OR gate $780_N$. B(1) port $208_1$ is connected to the second input of OR gate $780_1$. The output of OR gate $780_N$ is connected to the second input of NAND gate $790_N$ and to the non-inverting input of AND gate $750_N$. The output of OR gate $780_1$ is connected to the second input of NAND gate $790_1$ and to the non-inverting input of AND gate $750_1$. $OL_N$ port $106_N$ is connected to the output of AND gate $750_N$. OL(1) port $106_1$ is connected to the output of AND gate $750_1$. OH(1) port $105_1$ is connected to the output of NAND gate $790_1$. OH(N) port $105_N$ is connected to the output of NAND gate $790_N$.

Figure 4:
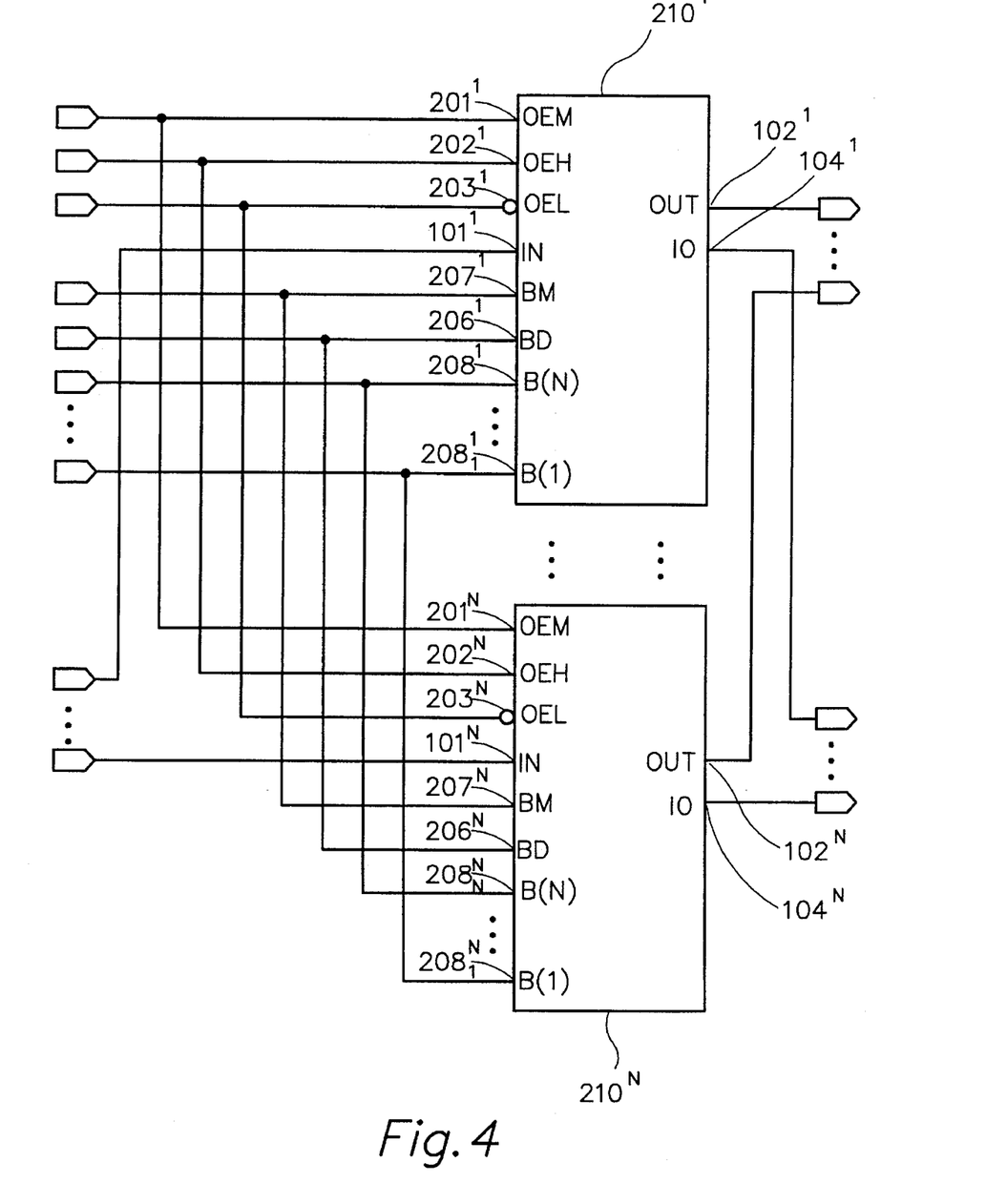
FIG. 4 is a schematic diagram depicting multiple bi-directional programmable I/O cells with common input bias and data output control busses.

FIG. 4 schematically depicts multiple bi-directional programmable I/O cells 200 having common control busses. Components having the same function as described in the previous figures have retained the same numerical identification. In this figure, only the first (x=1) and last (x=N) bi-directional programmable I/O cells $210^x$ are shown. In order to have bi-directional programmable I/O cells $210^x$ operate with common control busses, each port of each bi-directional programmable I/O cell $210^x$ are electrically connected to the same port of the other bi-directional programmable I/O cells $210^x$, with the exception of IN ports $101^x$, OUT ports $102^x$ and I/O ports $104^x$.

Although only two bi-directional programmable I/O cells 200 have been shown, one skilled in the art will recognize that several bi-directional programmable I/O cells 200 can be connected in the manner described. This is particularly useful in devices designed to operate with a parallel data bus. Many data buses have either 32, 64 or 128 data lines. To effectively control such a bus, a separate bi-directional programmable I/O cell 200 is needed for each line.

Although the present invention has been described with reference to preferred embodiments, those skilled in the art will recognize changes that may be made in form or detail without departing from the spirit and scope of the invention. For example, this invention has described four different impedances (30 ohms, 50 ohms, 75 ohms and a high impedance) that could be placed on interconnect 190. Different impedance values could be selected depending on the specific application. It should also be noted that the number of impedances to select from could either be increased or decreased. One skilled in the art will realize that such a change may require the addition or removal of impedance enable lines, transistor totem pole pairs and logic circuitry.

Controller 210 can have several different embodiments without deviating from the scope and spirit of the invention. For example, the bias input control bus could be replaced with a serial bias control register. Multiple bias control registers could be loaded through a single serial scan port, such as an IEEE 1149.1 bus.

I claim:

1. A bi-directional programmable I/O cell connected between an interconnect and a core, comprising:

a drive block connected to said interconnect, having at least one operating mode selected from a group of operating modes consisting of a data transmission mode, a bias impedance value mode and an impedance direction mode, each operating mode having a plurality of submodes; and a controller connected to said drive block, said interconnect, and said core in response to signals received from said core, activating a submode for each operating mode of said drive block.

2. A bi-directional programmable I/O cell as recited in claim 1, wherein said drive block bias impedance direction operating mode is comprised of an independent bias submode and a dependent bias submode.

3. A bi-directional programmable I/O cell as recited in claim 2, wherein said drive block independent bias submode is further comprised of a static submode and a dynamic submode.

4. A bi-directional programmable I/O cell as recited in claim 3, wherein said static submode is further comprised of a pull-up submode and a pull-down submode.

5. A bi-directional programmable I/O cell as recited in claim 2, wherein said drive block dependent bias submode is further comprised of a ring latch submode and an active termination submode.

6. A bi-directional programmable I/O cell as recited in claim 1, wherein said drive block data transmission mode is further comprised of a continuous transmission submode and a pulsed transmission submode.

7. A bi-directional programmable I/O cell as recited in claim 1, wherein said drive block impedance mode is further comprised of a 30-ohm impedance submode, a 50-ohm impedance submode, a 75-ohm impedance submode, and a high impedance submode.

8. A bi-directional programmable I/O cell connected between an interconnect and a core, comprising:

a drive block connected to said interconnect, having variable electrical operating characteristics; and a controller connected to said drive block, said interconnect, and said core in response to signals received from said core, configuring the variable electrical characteristics of said drive block.

9. A bi-directional programmable I/O cell connected between an interconnect having a signal and a core, comprising:

a drive block connected to said interconnect, having variable electrical operating characteristics; and a controller connected to said drive block, said interconnect, and said core, said controller having two modes of operation selected in response to signals received from said core: (i) an input mode to provide the core with a signal from the interconnect and configure the variable electrical characteristics of said drive block and (ii) an output mode to configure the variable electrical characteristics of said drive block so that the interconnect is driven to a specific voltage level.

10. A bi-directional programmable I/O cell connected between an interconnect and a core, comprising:

a drive block connected to said interconnect, having a data transmission mode, a bias impedance value mode and an impedance direction mode, each operating mode having a plurality of submodes; and a controller connected to said drive block, said interconnect, and said core in response to signals received from said core, activating a submode for each operating mode of said drive block.

11. A bi-directional programmable I/O cell as recited in claim 10, wherein said drive block bias impedance direction operating mode is comprised of an independent bias submode and a dependent bias submode.

12. A bi-directional programmable I/O cell as recited in claim 11, wherein said drive block independent bias submode is further comprised of a static submode and a dynamic submode.

13. A bi-directional programmable I/O cell as recited in claim 12, wherein said static submode is further comprised of a pull-up submode and a pull-down submode.

14. A bi-directional programmable I/O cell as recited in claim 11, wherein said drive block dependent bias submode is further comprised of a ring latch submode and an active termination submode.

15. A bi-directional programmable I/O cell as recited in claim 10, wherein said drive block data transmission mode is further comprised of a continuous transmission submode and a pulsed transmission submode.

16. A bi-directional programmable I/O cell as recited in claim 10, wherein said drive block impedance mode is further comprised of a 30-ohm impedance submode, a 50-ohm impedance submode, a 75-ohm impedance submode, and a high impedance submode.

17. A bi-directional programmable I/O cell connected between an interconnect and a core, comprising:

a drive block connected to said interconnect, having two mutually exclusive operating modes, a pulsed transmission mode and a continuous transmission mode; and a controller connected to said drive block, said interconnect, and said core in response to signals received from said core, activating one of the two mutually exclusive operating modes of said drive block.

18. A bi-directional programmable I/O cell connected between an interconnect and a core, comprising:

a drive block connected to said interconnect, having four mutually exclusive operating modes, a 30-ohm impedance mode, a 50-ohm impedance mode, a 75-ohm impedance mode, and a high impedance mode; and a controller connected to said drive block, said interconnect, and said core in response to signals received from said core, activating one of the four mutually exclusive operating modes of said drive block.

19. A bi-directional programmable I/O cell connected between an interconnect and a core, comprising:

a drive block connected to said interconnect, having two mutually exclusive operating modes, an independent bias mode and a dependent bias mode; and a controller connected to said drive block, said interconnect, and said core in response to signals received from said core, activating one of the two mutually exclusive operating modes of said drive block.

20. A bi-directional programmable I/O cell as recited in claim 19, wherein said drive block independent bias mode is further comprised of a static submode and a dynamic submode.

21. A bi-directional programmable I/O cell as recited in claim 20, wherein said static submode is further comprised of a pull-up submode and a pull-down submode.

22. A bi-directional programmable I/O cell as recited in claim 19, wherein said drive block dependent bias mode is further comprised of a ring latch submode and an active termination submode.

* * * * *

(12) EX PARTE REEXAMINATION CERTIFICATE (6533rd)

United States Patent
Sundstrom (10) Number: US 5,602,494 C1
(45) Certificate Issued: Nov. 25, 2008

(54) BI-DIRECTIONAL PROGRAMMABLE I/O CELL

(75) Inventor: Lance L. Sundstrom, Pinellas Park, FL (US)

(73) Assignee: Honeywell International Inc., Morristown, NJ (US)

Reexamination Request:
No. 90/007,825, Nov. 29, 2005

Reexamination Certificate for:
Patent No.: 5,602,494
Issued: Feb. 11, 1997
Appl. No.: 08/401,604
Filed: Mar. 9, 1995

(51) Int. Cl.
*H03K 19/185* (2006.01)

(52) U.S. Cl. .............................. 326/39; 326/30; 326/86
(58) Field of Classification Search .................... 326/82, 326/86, 90, 91; 327/309, 312, 313, 321
See application file for complete search history.

(56) References Cited

U.S. PATENT DOCUMENTS

| | | | | |
|---|---|---|---|---|
| 4,462,084 A | 7/1984 | Greenwood | .................. | 364/900 |
| 4,581,551 A | 4/1986 | Campbell, Jr. | .............. | 307/475 |
| 4,680,487 A | 7/1987 | Kobayashi | .................. | 307/475 |
| 4,697,107 A | 9/1987 | Haines | ........................ | 307/474 |
| 4,719,369 A * | 1/1988 | Asano et al. | .................... | 326/30 |
| 4,745,305 A | 5/1988 | Crafts | ........................ | 307/475 |
| 4,758,746 A | 7/1988 | Birkner et al. | .............. | 307/465 |
| 4,880,997 A | 11/1989 | Steele | ........................ | 407/443 |
| 4,910,704 A | 3/1990 | Gemma | ...................... | 364/900 |
| 4,945,395 A | 7/1990 | Suehiro | ........................ | 357/40 |
| 4,978,633 A | 12/1990 | Seefeldt et al. | ............... | 437/51 |
| 5,015,884 A | 5/1991 | Agrawal et al. | ............. | 307/465 |
| 5,017,813 A | 5/1991 | Galbraith et al. | ............ | 307/475 |
| 5,051,917 A | 9/1991 | Gould et al. | .................. | 364/489 |
| 5,113,368 A | 5/1992 | Le Calvez et al. | ........... | 395/250 |
| 5,134,311 A | 7/1992 | Biber et al. | .................. | 307/270 |
| 5,162,672 A | 11/1992 | McMahan et al. | ........... | 307/443 |
| 5,172,014 A | 12/1992 | El Ayat et al. | ............... | 307/465 |
| 5,216,292 A | 6/1993 | Imazu et al. | ................. | 307/443 |
| 5,218,242 A | 6/1993 | Imazu et al. | ................. | 307/443 |
| 5,254,883 A | 10/1993 | Horowitz et al. | ............ | 307/443 |
| 5,282,271 A | 1/1994 | Hsieh et al. | | |
| 5,317,210 A | 5/1994 | Patel | .......................... | 307/465 |
| 5,331,220 A * | 7/1994 | Pierce et al. | .................. | 326/57 |
| 5,332,932 A | 7/1994 | Runaldue | ..................... | 307/443 |
| 5,394,034 A | 2/1995 | Becker et al. | .................. | 326/39 |
| 5,399,922 A | 3/1995 | Kiani et al. | .................... | 326/40 |
| 5,424,589 A | 6/1995 | Dobbelaere et al. | ........... | 326/41 |
| 5,448,182 A | 9/1995 | Countryman et al. | ......... | 326/30 |
| 5,466,975 A | 11/1995 | Wratten | ....................... | 307/100 |
| 5,500,611 A | 3/1996 | Popat et al. | ................... | 326/87 |
| 5,550,486 A | 8/1996 | Sweeney et al. | .............. | 326/14 |
| 5,585,741 A | 12/1996 | Jordan | ......................... | 326/30 |
| 5,615,404 A | 3/1997 | Knoll et al. | .................. | 395/882 |

(Continued)

FOREIGN PATENT DOCUMENTS

EP 0 542 227 B1 5/1993

OTHER PUBLICATIONS

8–Bit CMOS EEPROM Microcontroller, Microchip PIC16C84, 1995, 104 pgs.

(Continued)

*Primary Examiner*—Woo H. Choi (57) ABSTRACT

A bi-directional programmable I/O cell is disclosed. The bi-directional programmable I/O cell has variable electrical characteristics which are selected via control inputs. The variable electrical characteristics can include a data transmission mode, an input bias impedance value and an input bias direction mode. The input bias direction mode has an independent submode and a dependent submode. The dependent submode can operate in a ring latch mode or an active termination mode. The independent submode is further comprised of a static submode and a dynamic submode. The static submode is further comprised of a pull-up mode and a pull-down mode. The bias impedance value is can be selected from a plurality of impedances. The bi-directional programmable I/O cell has a continuous or pulsed output in the data transmission mode.

U.S. PATENT DOCUMENTS

| | | | |
|---|---|---|---|
| 5,623,610 A | 4/1997 | Knoll et al. | 395/281 |
| 5,694,555 A | 12/1997 | Morriss et al. | 395/280 |
| 5,742,847 A | 4/1998 | Knoll et al. | 395/866 |
| 5,909,556 A | 6/1999 | Morriss et al. | 395/280 |

OTHER PUBLICATIONS

CHMOS Programmable Peripheral Interface, Intel 82C55A, Oct. 1995, 23 pgs.

Dehon et al., TP 10.7: Automatic Impedance Control, ISSCC93/Session 10/High–Speed Communication and Interfaces/Paper 10.7, 3 pgs., 1993 IEEE International Solid State Circuits Conference.

Detar, I–Cube maps networking IC blitz—I–Cube Inc's new field programmable interconnect devices, Electronic News, 2 pgs., Jun. 13, 1994, available at <http://www.findarticles.com/p/articles/mi_m0EKF/is_n2018_v40/ai_15517123/print (visited Jul. 29, 2005).

Detar, Altera debuts PC board for high–capacity logic—Altera Corp. introduces Reconfigurable Interconnect Peripheral Processor programmable logic board—Product Announcement, Electronic News, 2 pgs., Feb. 14, 1994, available at <http://www.findarticles.com/p/articles/mi_m0EKF/is_n2001_v40/ai_15031891/print (visited Jul. 29, 2005).

Dolle, A Dynamic Line–Termination Circuit for Multireceiver Nets, IEEE Journal of Solid–State Circuits, vol. 28, No. 12, pp. 1370–1373, Dec. 1993.

Gabara et al., Digitally Adjustable Resistors in CMOS for High–Performance Applications, IEEE Journal of Solid–State Circuits, vol. 27, No. 8, pp. 1176–1185, Aug. 1992.

Knight, Jr. et al., A Self–Terminating Low–Voltage Swing CMOS Output Driver, IEEE Journal of Solid–State Circuits, vol. 23, No. 2, pp. 457–464, Apr. 1988.

Kushiyama et al., A 500–Megabyte/s Data–Rate 4.5M DRAM, IEEE Journal of Solid–State Circuits, vol. 28, No. 4, pp. 490–498; Apr. 1993.

Lam et al., Simultaneously Bidirectional Signalling for IC Systems, pp. 430–433, 1990.

Mooney et al., WP 2.4: A 900Mb/s Bidirectional Signaling Scheme, ISSCC95/Session 2/Data Communications/Paper WP 2.4, 3 pgs., 1995 IEEE International Solid State Circuits Conference.

Motorola HC11 M68HC11 N Series Technical Data, 1993.

NEC Electronics, Inc., CMOS–6/6A/6V/6X 1.0 Micron CMOS Gate Arrays, 15 pgs., Apr. 1992.

Octagon Systems Corporation, 5648 User's Manual Doc. #03764 Rev 0194, 50 pgs., 1994.

SGS–Thomson, ISB35000 Series, HCMOS Structured Array, pp. 1–15, May 1994.

Sherhart et al., A Variable–Voltage Bidirectional I/O Pad for Digital GaAs Applications, GaAs IC Symposium, pp. 67–70, 1994.

Stockinger, SGS–Thomson Microelectronics Application Note, Using ST62xx I/O Ports Safely, 10 pgs., 1994.

Suehiro et al., Development of Sea of Gates, Fujitsu Sci. Tech. J., 24, 4, pp. 318–327, Dec. 1988.

Suehiro et al., A 120K–Gate Usable CMOS Sea of Gates Packing 1.3M Transistors, IEEE 1988 Custom Integrated Circuits Conference, pp. 20.5.1–20.5.4.

Takahashi et al., WP 2.5: A CMOS Gate Array with 600Mb/s Simultaneous Bidirectional I/O Circuits, ISSCC95/Session 2/Data Communications/Paper WP 2.5, pp. 40–41, 1995 IEEE International Solid State Circuits Conference.

Universal Serial Bus Specification Revision 1.0, 268 pgs. (Rev. 1.0 is dated Jan. 15, 1996; see p. 2 for information on earlier revisions).

Universal Serial Bus Specification Revision 1.1, 311 pgs. (Rev. 1.1 is dated Sep. 23, 1998; see p. ii for information on earlier revisions).

XILNX, The Programmable Logic Data Book, pp. 2–7 to 2–46, 1994.

Zarlink Semiconductor, MVA 60000 Series, 1.4 Micron CMOS Megacell ASICs, 21 pgs., Mar. 1991.

* cited by examiner

US 5,602,494 C1

EX PARTE REEXAMINATION CERTIFICATE ISSUED UNDER 35 U.S.C. 307

THE PATENT IS HEREBY AMENDED AS INDICATED BELOW.

Matter enclosed in heavy brackets [ ] appeared in the patent, but has been deleted and is no longer a part of the patent; matter printed in italics indicates additions made to the patent.

AS A RESULT OF REEXAMINATION, IT HAS BEEN DETERMINED THAT:

The patentability of claims 1–22 is confirmed.

New claims 23–58 are added and determined to be patentable.

23. *The bi-directional programmable I/O cell of claim 1, wherein the at least one operating mode is the impedance direction mode.*

24. *The bi-directional programmable I/O cell of claim 1, wherein the at least one operating mode is the data transmission mode, and wherein the plurality of submodes for the data transmission mode comprise a pulsed data transmission submode and a continuous data transmission submode.*

25. *A bi-directional programmable I/O cell connected between an interconnect and a core, comprising:*
   *a drive block connected to said interconnect, having at least one operating mode selected from a group of operating modes consisting of a data transmission mode, a bias impedance value mode and an impedance direction mode, each operating mode having a plurality of submodes; and*
   *a controller connected to said drive block, said interconnect, and said core in response to signals received from said core, activating a submode for each operating mode of said drive block, wherein the at least one operating mode is the bias impedance value mode.*

26. *A bi-directional programmable I/O cell connected between an interconnect and a core, comprising:*
   *a drive block connected to said interconnect, having at least one operating mode selected from a group of operating modes consisting of a data transmission mode, a bias impedance value mode, an impedance direction mode, and combinations thereof, each operating mode having a plurality of submodes; and*
   *a controller connected to said drive block, said interconnect, and said core in response to signals received from said core, activating a submode for each operating mode of said drive block.*

27. *A bi-directional programmable I/O cell connected between an interconnect and a core, comprising:*
   *a drive block connected to said interconnect, having at least one operating mode selected from a group of operating modes consisting of a data transmission mode, a bias impedance value mode and an impedance direction mode, each operating mode having a plurality of submodes; and*
   *a controller connected to said drive block, said interconnect, and said core, said controller comprising means for, in response to signals received from said core, activating a submode for each operating mode of said drive block.*

28. *The bi-directional programmable I/O cell of claim 27, wherein the at least one operating mode is the impedance direction mode.*

29. *The bi-directional programmable I/O cell of claim 27, wherein the at least one operating mode is the data transmission mode, and wherein the plurality of submodes for the data transmission mode comprise a pulsed data transmission submode and a continuous data transmission submode.*

30. *A bi-directional programmable I/O cell connected between an interconnect and a core, comprising:*
   *a drive block connected to said interconnect, having at least one operating mode selected from a group of operating modes consisting of a data transmission mode, a bias impedance value mode and an impedance direction mode, each operating mode having a plurality of submodes; and*
   *a controller connected to said drive block, said interconnect, and said core, said controller comprising means for, in response to signals received from said core, activating a submode for each operating mode of said drive block, wherein the at least one operating mode is the bias impedance value mode.*

31. *A bi-directional programmable I/O cell connected between an interconnect and a core, comprising:*
   *a drive block connected to said interconnect, having at least one operating mode selected from a group of operating modes consisting of a data transmission mode, a bias impedance value mode, an impedance direction mode, and combinations thereof, each operating mode having a plurality of submodes; and*
   *a controller connected to said drive block, said interconnect, and said core, said controller comprising means for, in response to signals received from said core, activating a submode for each operating mode of said drive block.*

32. *The bi-directional programmable I/O cell of claim 8, wherein the I/O cell is configured for receiving an input signal from said interconnect and providing the received input signal to said core.*

33. *The bi-directional programmable I/O cell of claim 32, wherein the I/O cell is configured for receiving an input signal from said core and providing the received input signal to said interconnect.*

34. *A bi-directional programmable I/O cell connected between an interconnect and a core, comprising:*
   *a drive block connected to said interconnect, having variable electrical operating characteristics; and*
   *a controller connected to said drive block, said interconnect, and said core in response to signals received from said core, configuring the variable electrical characteristics of said drive block, wherein said controller is configured for configuring at least one of the variable electrical characteristics to match an impedance of the drive block to an impedance of said interconnect.*

35. *A bi-directional programmable I/O cell connected between an interconnect and a core, comprising:*
   *a drive block connected to said interconnect, having variable electrical operating characteristics; and*
   *a controller connected to said drive block, said interconnect, and said core, said controller comprising means for, in response to signals received from said core, configuring the variable electrical characteristics of said drive block.*

36. *The bi-directional programmable I/O cell of claim 35, wherein the I/O cell is configured for receiving an input* signal from said interconnect and providing the received input signal to said core.

37. The bi-directional programmable I/O cell of claim 35, wherein the I/O cell is configured for receiving an input signal from said core and providing the received input signal to said interconnect.

38. A bi-directional programmable I/O cell connected between an interconnect and a core, comprising:
   a drive block connected to said interconnect, having variable electrical operating characteristics; and
   a controller connected to said drive block, said interconnect, and said core, said controller comprising means for, in response to signals received from said core, configuring the variable electrical characteristics of said drive block, wherein said configuring means is configured for configuring at least one of the variable electrical characteristics to match an impedance of the drive block to an impedance of said interconnect.

39. A bi-directional programmable I/O cell connected between an interconnect and a core, comprising:
   a drive block connected to said interconnect, having variable electrical operating characteristics; and
   a controller connected to said drive block, said interconnect, and said core in response to signals received from said core, configuring the variable electrical characteristics of said drive block, wherein said controller is configured for configuring at least one of the variable electrical characteristics to reduce a transmission line effect of said interconnect.

40. A bi-directional programmable I/O cell connected between an interconnect and a core, comprising:
   a drive block connected to said interconnect, having variable electrical operating characteristics; and
   a controller connected to said drive block, said interconnect, and said core, said controller comprising means for, in response to signals received from said core, configuring the variable electrical characteristics of said drive block, wherein said configuring means is configured for configuring at least one of the variable electrical characteristics to reduce a transmission line effect of said interconnect.

41. A bi-directional programmable I/O cell connected between an interconnect and a core, comprising:
   a drive block connected to said interconnect, having variable electrical operating characteristics; and
   a controller connected to said drive block, said interconnect, and said core in response to signals received from said core, configuring the variable electrical characteristics of said drive block, wherein at least one of the variable electrical characteristics comprises an impedance.

42. The bi-directional programmable I/O cell of claim 41, wherein the impedance matches an impedance of the interconnect.

43. A bi-directional programmable I/O cell connected between an interconnect and a core, comprising:
   a drive block connected to said interconnect, having variable electrical operating characteristics; and
   a controller connected to said drive block, said interconnect, and said core, said controller comprising means for, in response to signals received from said core, configuring the variable electrical characteristics of said drive block, wherein at least one of the variable electrical characteristics comprises an impedance.

44. The bi-directional programmable I/O cell of claim 43, wherein the impedance matches an impedance of the interconnect.

45. A bi-directional programmable I/O cell connected between an interconnect and a core, comprising:
   a drive block connected to said interconnect, having variable electrical operating characteristics; and
   a controller connected to said drive block, said interconnect, and said core in response to signals received from said core, configuring the variable electrical characteristics of said drive block, wherein at least one of the variable electrical characteristics comprises an input impedance.

46. A bi-directional programmable I/O cell connected between an interconnect and a core, comprising:
   a drive block connected to said interconnect, having variable electrical operating characteristics; and
   a controller connected to said drive block, said interconnect, and said core, said controller comprising means for, in response to signals received from said core, configuring the variable electrical characteristics of said drive block, wherein at least one of the variable electrical characteristics comprises an input impedance.

47. A bi-directional programmable I/O cell connected between an interconnect and a core, comprising:
   a drive block connected to said interconnect, having variable electrical operating characteristics; and
   a controller connected to said drive block, said interconnect, and said core in response to signals received from said core, configuring the variable electrical characteristics of said drive block during an input mode and during an output mode, wherein at least one of the variable electrical characteristics comprises an impedance and wherein said controller, in either the input mode or the output mode, configures the impedance relative to an impedance of said interconnect.

48. A bi-directional programmable I/O cell connected between an interconnect and a core, comprising:
   a drive block connected to said interconnect, having variable electrical operating characteristics; and
   a controller connected to said drive block, said interconnect, and said core, said controller comprising means for, in response to signals received from said core, configuring the variable electrical characteristics of said drive block during an input mode and during an output mode, wherein at least one of the variable electrical characteristics comprises an impedance and wherein said controller, in either the input mode or the output mode, configures the impedance relative to an impedance of said interconnect.

49. The bi-directional programmable I/O cell of claim 47 or 48, wherein the impedance is configured to match the impedance of said interconnect.

50. The bi-directional programmable I/O cell of claims 34, 38, 41, or 43, wherein the impedance comprises a bias impedance.

51. A bi-directional programmable I/O cell connected between an interconnect having a signal and a core, comprising:
   a drive block connected to said interconnect, having variable electrical operating characteristics; and
   a controller connected to said drive block, said interconnect, and said core, said controller having at least two modes of operation selected in response to signals received from said core: (i) an input mode to provide the core with a signal from the interconnect and configure the variable electrical characteristics of said drive block and (ii) an output mode to provide the interconnect with a signal from the core and to configure the variable electrical characteristics of said drive block so that the interconnect is driven to a specific voltage level;

wherein at least one of the variable electrical characteristics is an impedance and wherein said controller is configured for, in either the input mode or the output mode, configuring the impedance relative to an impedance of said interconnect.

52. The bi-directional programmable I/O cell of claim 51, wherein said controller is configured for configuring the impedance to match the impedance of said interconnect.

53. The bi-directional programmable I/O cell of claims 1, 10, 25, 26, 27, 30 or 31, wherein the controller activates a submode for each operating mode of said drive block further in response to signals received from said interconnect.

54. The bi-directional programmable I/O cell of claims 8, 34, 39, 41, 45 or 47, wherein the controller configures the variable electrical characteristics of said drive block further in response to signals received from said interconnect.

55. The bi-directional programmable I/O cell of claims 35, 38, 40, 43, 46 or 48, wherein the means for configuring the variable electrical characteristics configures the variable electrical characteristics of said drive block further in response to signals received from said interconnect.

56. The bi-directional programmable I/O cell of claim 9, wherein the controller selects the modes of operation further in response to signals received from said interconnect.

57. The bi-directional programmable I/O cell of claims 17, 19 or 51, wherein the controller activates one of the two mutually exclusive operating modes of said drive block further in response to signals received from said interconnect.

58. The bi-directional programmable I/O cell of claim 18, wherein the controller activates one of the four mutually exclusive operating modes of said drive block further in response to signals received from said interconnect.

* * * * *